United States Patent
Suh et al.

(10) Patent No.: US 7,355,198 B2
(45) Date of Patent: Apr. 8, 2008

(54) ORGANIC THIN FILM TRANSISTOR INCLUDING ORGANIC ACCEPTOR FILM

(75) Inventors: Min-Chul Suh, Seongnam-si (KR); Nam-Choul Yang, Seoul (KR); Hye-Dong Kim, Seongnam-si (KR)

(73) Assignee: Samsung SDI Co., Ltd., Suwon-si, Gyeonggi-di (KR)

( * ) Notice: Subject to any disclaimer, the term of this patent is extended or adjusted under 35 U.S.C. 154(b) by 109 days.

(21) Appl. No.: 11/010,341

(22) Filed: Dec. 14, 2004

(65) Prior Publication Data
US 2005/0242342 A1    Nov. 3, 2005

(30) Foreign Application Priority Data
Apr. 29, 2004  (KR)  .................... 10-2004-0030222

(51) Int. Cl.
*H01L 29/08* (2006.01)
(52) U.S. Cl. ................... 257/40; 257/E39.007
(58) Field of Classification Search ........... 257/40, 257/E39.007
See application file for complete search history.

(56) References Cited

U.S. PATENT DOCUMENTS

| | | | |
|---|---|---|---|
| 6,278,127 B1 * | 8/2001 | Dodabalapur et al. | 257/40 |
| 6,326,640 B1 | 12/2001 | Shi et al. | |
| 6,433,359 B1 * | 8/2002 | Kelley et al. | 257/40 |
| 6,734,038 B2 * | 5/2004 | Shtein et al. | 438/99 |
| 2003/0102471 A1 * | 6/2003 | Kelley et al. | 257/40 |

FOREIGN PATENT DOCUMENTS

| | | |
|---|---|---|
| JP | 6-318725 | 11/1994 |
| JP | 9-139288 | 5/1997 |
| JP | 11-49968 | 2/1999 |
| JP | 2001-244467 | 9/2001 |
| JP | 2004-103905 | 4/2004 |
| KR | 10-2002-0084427 | 11/2002 |

OTHER PUBLICATIONS

Korean Office Action of the Korean Patent Application No. 10-2004-0030222, mailed on Dec. 16, 2005.
*Very-Loow-operating-voltage organic light-emitting diodes using a p-doped amorphous hole injection layer*, by Xiang Zhou et al., Applied Physics Letters, vol. 78, No. 4, pp. 410-412, Jan. 22, 2001.
Japanese Office action corresponding to Japanese Patent Application No. 2005-058809, issued on Feb. 27, 2007.
"Characteristics of Pentacene Organic Thin Film Transistors with Gate Insulator Processed by Organic Molecules," by Song, et al. Jpn. J. Appl. Phys. vol. 41 (2002) pp. 2730-2734.

* cited by examiner

*Primary Examiner*—Eugene Lee
(74) *Attorney, Agent, or Firm*—Robert E. Bushnell, Esq.

(57) ABSTRACT

An organic thin film transistor (TFT) includes: an organic semiconductor film; source and drain electrodes electrically connected to the organic semiconductor film; a gate electrode electrically insulated from the source and drain electrodes and the organic semiconductor film; and an organic acceptor film interposed between the source and drain electrodes and the organic semiconductor film.

18 Claims, 9 Drawing Sheets

ORGANIC THIN FILM TRANSISTOR INCLUDING ORGANIC ACCEPTOR FILM

CLAIM OF PRIORITY

This application makes reference to, incorporates the same herein, and claims all benefits accruing under 35 U.S.C. §119 from an application entitled ORGANIC THIN FILM TRANSISTOR COMPRISING ORGANIC ACCEPTOR FILM filed with the Korean Intellectual Property Office on 29 Apr. 2004, and there duly assigned Serial No. 2004-30222.

BACKGROUND OF THE INVENTION

1. Technical Field

The present invention relates to an organic thin film transistor (TFT) and, more particularly, to an organic TFT which includes an organic acceptor film disposed between source and drain electrodes and an organic semiconductor film to obtain a doping effect.

2. Related Art

Since the development of polyacetylene, which is a conjugated organic polymer, intensive research for organic semiconductors has progressed in the fields of functional electronic and optical devices. Like other organic materials, organic semiconductors can be variously synthesized and easily molded into fibers or films. Also, organic semiconductors are highly flexible, conductive and economical. Organic thin film transistors (TFTs) of devices using conductive polymers include organic active films, and studies of organic TFTs began in 1980 and continue all over the world.

An organic TFT is structurally similar to a silicon TFT, except that a semiconductor active region is formed from an organic material instead of silicon. Compared to the silicon TFT, the organic TFT is simple to manufacture, economical, highly resistant to shock, and suitable for a substrate that is bent or folded. In particular, when an organic TFT is manufactured on a large area, the organic TFT is useful for products that require a low process temperature and need to be bent.

It is highly feasible that organic TFTs be used for driving devices of active matrix organic electro-luminescent display devices, smart cards, and plastic chips for smart tags or radio frequency identification (RFID). Thus, organic TFTs are now studied by many manufacturers, laboratories and colleges worldwide. The performance of an organic TFT depends on the capability of injecting carriers into an interface between a source/drain electrode and an organic semiconductor film.

Generally, the organic TFT is structurally similar to a silicon transistor. Like a field effect transistor (FET), the organic TFT operates on the principle that, when a voltage is applied to a gate, an electric field is applied to a gate insulating film. A current flowing through the organic TFT is obtained by applying a voltage between source and drain regions. In this case, the source region is grounded and supplies electrons or holes. The semiconductor active film located on the source and drain regions is an organic semiconductor film.

When no voltage is applied to the source and drain regions and the gate, charge is uniformly distributed throughout the semiconductor active film.

When a voltage lower than the threshold voltage of the TFT is applied to the gate, a current flows between drain and source in proportion on the applied voltage. If a voltage higher than the threshold voltage of the TFT (i.e., a positive voltage) is applied to the gate, positive charges (i.e., holes) are pushed upward due to an electric field caused by the applied voltage. As a result, a depletion film which includes no conductive charges is formed near a gate insulating film. In this case, when a voltage is applied between the source and drain regions, conductive charge carriers are reduced so that a current flows therebetween, and that current is smaller than when no voltage is applied to the gate.

On the contrary, if a voltage lower than the threshold voltage (i.e., a negative voltage) is applied to the gate, an electric field is generated in the gate insulating film. The electric field induces conductive charge carriers in the semiconductor active film, and the conductive charge carriers are accumulated between drain and source. The accumulated conductive charge carriers form the current channel between drain and source.

Therefore, the current flowing between the source and drain regions can be controlled by continuously applying a voltage therebetween, and by applying a positive or negative voltage to the gate. The ratio of the current when a positive voltage is applied to the current when a negative voltage is applied is referred to as the on/off ratio. The on/off ratio of an organic TFT is, preferably, as high as possible.

Various materials for forming the semiconductor active film of the organic TFT have been developed. The semiconductor active film maybe formed of organic semiconductors, such as pentacene, oligo-thiophene, poly(alkylthiophene), and poly(thienylenevinylene). Also, the organic semiconductor active film may be formed using vacuum deposition, preferably by thermal evaporation.

An organic TFT has the disadvantage of low charge mobility. After an FET including a pentacene thin film was developed by Brown et al. of Philips in 1995, Jackson et al. from Pennsylvania State University facilitated crystallization, and invented a transistor having a charge mobility of 1.5 $cm^2/Vs$ and an on/off ratio of about $10^8$, which are equivalent to the characteristics of an a-Si:H FET. Pentacene, which consists of five benzene rings, is considered to be the most useful material that meets the requisite performance for a TFT.

A pentacene organic TFT exhibits the highest mobility among p-type semiconductors and realizes the same performance as an a-Si transistor. However, it is known that pentacene reacts with oxygen in the air, thus generating pentacenequinone. Once an organic semiconductor active film is oxidized, its coupling structure is broken, lowering charge mobility and causing lattice distortion of the interior of crystals. As a result, charge traps are formed so as to provoke charge scattering, which further deteriorates charge mobility.

Meanwhile, a method of doping a pentacene active film to enhance charge mobility was disclosed by Brown et al. of Philips. However, this method reveals a problem in that, although charge mobility increases with an increase in doping, the conductivity of an active film increases more than the charge mobility, thus reducing the on/off ratio. Accordingly, the foregoing doping method produces adverse effects, that is, an increase in the conductivity of the active film and a reduction in the on/off ratio.

Meanwhile, an organic light emitting device (OLED), which includes an organic film formed by depositing both an $F_4$-TCNQ acceptor film and an amorphous TDATA, was proposed by Xiang Zhou et al. in Applied Physics Letters, Vol. 78, No. 4, 22 Jan. 2001. According to this paper, experimental results show that, as the OLED had a double or multiple layered structure including an amorphous TDATA and an F$_4$-TCNQ acceptor film, current density increased, turn-on voltage decreased, and brightness improved.

SUMMARY OF THE INVENTION

The present invention provides an organic thin film transistor (TFT) which improves the charge mobility of an organic semiconductor film.

The present invention also provides an organic TFT which interposes an organic acceptor film between source and drain electrodes and an organic semiconductor film. Thus, contact resistance between the source and drain electrodes and the organic semiconductor film is reduced, and charge mobility is improved.

The present invention further provides an organic TFT which includes a surface processing film for crowding pentacene molecules and reinforcing interfacial adhesion, thus improving charge mobility.

According to an aspect of the present invention, there is provided an organic thin film transistor comprising: an organic semiconductor film; source and drain electrodes electrically connected to the organic semiconductor film; a gate electrode electrically insulated from the source and drain electrodes and the organic semiconductor film; and an organic acceptor film interposed between the source and drain electrodes and the organic semiconductor film.

The organic semiconductor film is formed of pentacene.

The transistor further includes a gate insulating film which electrically insulates the source and drain electrodes from the gate electrode, and the organic acceptor film contacts the source and drain electrodes and the gate insulating film. In this case, the transistor includes a surface processing film which reinforces adhesion between the gate insulating film and the organic acceptor film.

In another case, the transistor further includes a gate insulating film which electrically insulates the source and drain electrodes from the gate electrode, and the organic acceptor film contacts the source and drain electrodes. In this case, the transistor further includes a surface processing film which reinforces adhesion between the gate insulating film and the organic semiconductor film.

The organic acceptor film is formed of at least one electron withdrawing material selected from the group consisting of aromatic compounds, olefine compounds, aromatic-olefine compounds, aromatic-aromatic conjugated compounds, fused aromatic compounds, and hetero cyclic compounds, which contain at least one selected from the group consisting of nitro group (NO$_2$), cyano group (CN), sulfonyl group (SO$_2$), sulfoxide group (SO), carbonyl group (CO), carboxyl group (CO$_2$), ester group (COO), anhydride, imide, imine, halogen group, fluoroalkyl group, and fluoroaromatic group.

In particular, the organic acceptor film is formed of at least one electron withdrawing material selected from the group consisting of 2,4,7-trinitrofluorenone, 4-nitroaniline, 2,4-dinitroaniline, 5-nitroanthranilonitrile, 2,4-dinitrophenylamine, 1,5-dinitronaphthalene, 4-nitrobiphenyl, 9,10-dicyanoanthracene, 3,5-dinitrobenzonitrile, and N,N'-bis(di-t-buytlphenyl)-3,4,9,10-perylenedicarboxyimide.

The organic acceptor film has a thickness of 1 to 100 Å.

The surface processing film is formed of any one selected from the group consisting of trichlorosilyl-(—SiCl$_3$), trimethoxysilyl-(—Si(OMe)$_3$), and mercapto-(—SH) moieties.

Also, the organic acceptor film is formed by co-depositing the material which forms the organic semiconductor film and the material which forms the organic acceptor film around the interface between the organic semiconductor film and the source and drain electrodes, and is formed of 0.1 to 10% by weight of the material forming the organic acceptor film.

According to another aspect of the present invention, there is provided an organic thin film transistor comprising: a gate electrode disposed on a substrate; a gate insulating film covering the substrate and the gate electrode; source and drain electrodes disposed on the gate insulating film; an organic semiconductor film disposed on the source and drain electrodes; and an organic acceptor film interposed between the source and drain electrodes and the organic semiconductor film.

According to yet another aspect of the present invention, there is provided an organic thin film transistor comprising: a gate electrode disposed on a substrate; a gate insulating film covering the substrate and the gate electrode; an organic semiconductor film disposed on the gate insulating film; source and drain electrodes disposed on the organic semiconductor film; and an organic acceptor film interposed between the source and drain electrodes and the organic semiconductor film.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, an organic thin film transistor (TFT) according to exemplary embodiments of the present invention will be described with reference to the attached drawings.

Figure 1A:
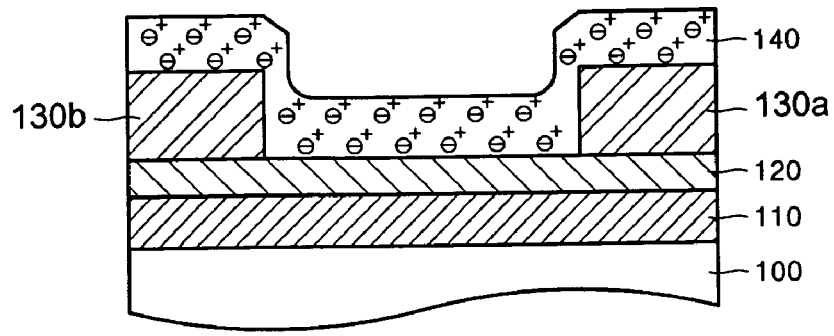
FIGS. 1A thru 1C are conceptual diagrams showing the structure of an organic thin film transistor (TFT) and the principle on which it operates.
Figure 1B:
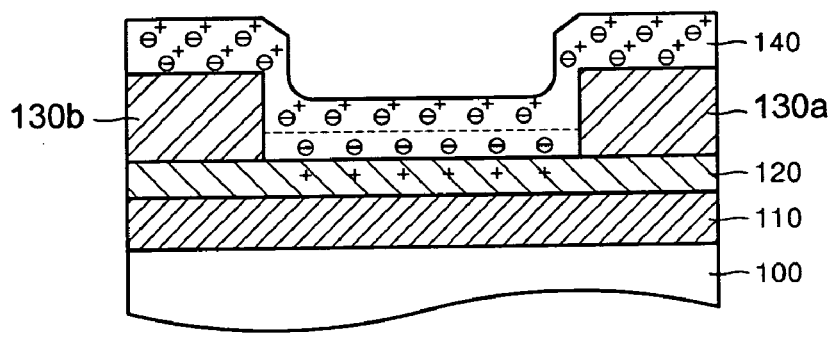
Figure 1C:
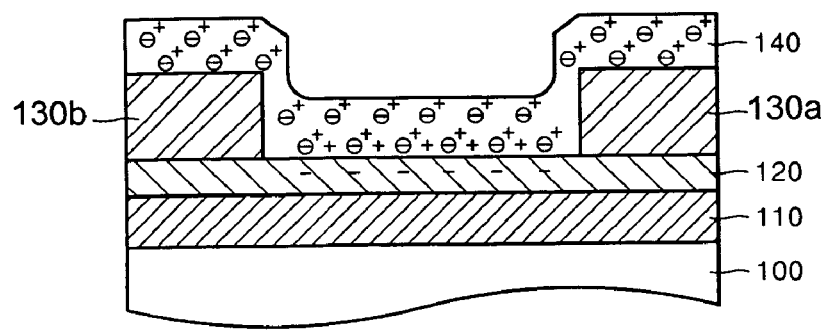

FIGS. 1A thru 1C are conceptual diagrams illustrating the principle on which an organic TFT operates. Generally, the organic TFT is structurally similar to a silicon transistor. Like a field effect transistor (FET), the organic TFT operates on the principle that, when a voltage is applied to a gate 110, an electric field is applied to a gate insulating film 120. A current flowing through the organic TFT is obtained by applying a voltage between a source region 130a and a drain region 130b. In this case, the source region 130a is grounded and supplies electrons or holes. The semiconductor active film 140 disposed on the source region 130a and the drain region 130b is an organic semiconductor film.

The principle of the organic TFT will now be described in connection with a p-type semiconductor film.

Referring to FIG. 1A, when no voltage is applied to the source region 130a and drain region 130b and to the gate 110, charge is uniformly distributed throughout the semiconductor active film 140.

When a voltage lower than the threshold voltage of the TFT is applied to the gate 110, a current flows between drain region 130b and source region 130a in proportion to the applied voltage. Referring to FIG. 1B, if a voltage higher than the threshold voltage of the TFT (i.e., a positive voltage) is applied to the gate 110, positive charges (i.e., holes) are pushed upward due to an electric field caused by the applied voltage. As a result, a depletion film which includes no conductive charges is formed near the gate insulating film 120. In this case, when a voltage is applied between source region 130a and drain region 130b, conductive charge carriers are reduced so that a current flows therebetween, and that current is smaller than when no voltage is applied to the gate 110.

Conversely, referring to FIG. 1C, if a voltage lower than the threshold voltage (i.e., a negative voltage) is applied to the gate 110, an electric field is generated in the gate insulating film 120. The electric field induces conductive charge carriers in the semiconductor active film 140, and the conductive charge carriers are accumulated between drain region 130b and source region 130a. The accumulated conductive charge carriers form the current channel between drain region 130b and source region 130a.

Therefore, the current flowing between source region 130a and drain region 130b can be controlled by continuously applying a voltage therebetween, and by applying a positive or negative voltage to the gate 110. The ratio of the current when a positive voltage is applied to the current when a negative voltage is applied is referred to as the on/off ratio. The on/off ratio of an organic TFT is, preferably, as high as possible.

Various materials for forming the semiconductor active film 140 of the organic TFT have been developed. The semiconductor active film 140 may be formed of organic semiconductors, such as pentacene, oligo-thiophene, poly (alkyl-thiophene), and poly(thienylenevinylene). Also, the organic semiconductor active film 140 may be formed using vacuum deposition, preferably by thermal evaporation.

Figure 2A:
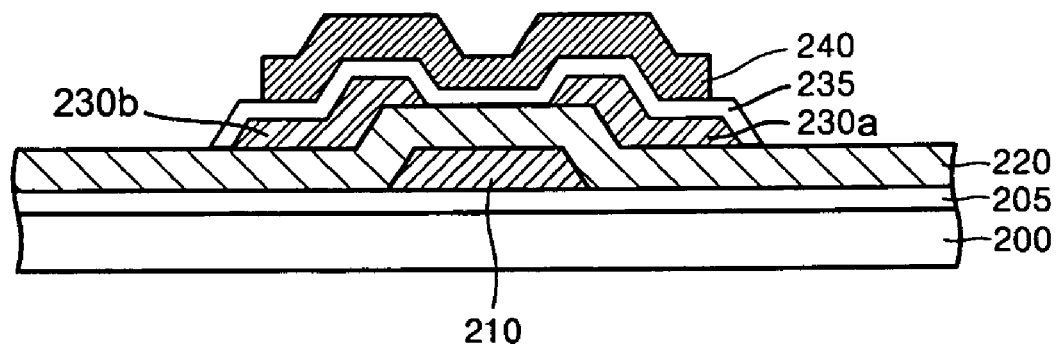
FIGS. 2A and 2B are cross-sectional views of an organic TFT according to an embodiment of the present invention.
Figure 2B:
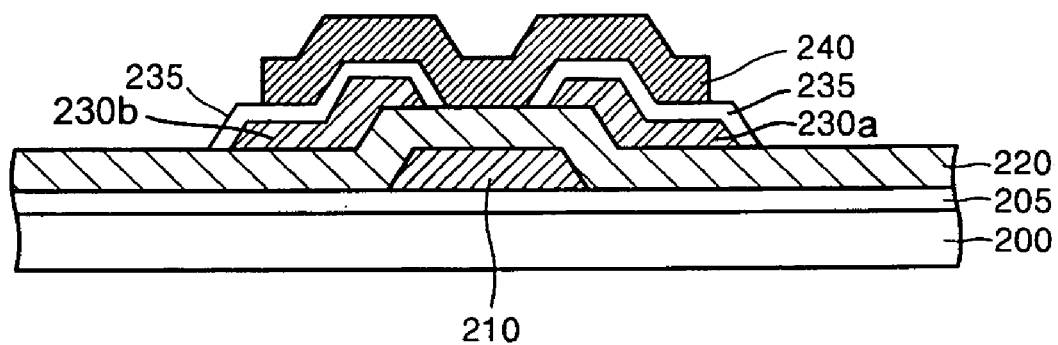

FIGS. 2A and 2B are cross-sectional views of an organic TFT according to an embodiment of the present invention.

Referring to FIG. 2A, the organic TFT includes a gate electrode 210 which is located on an insulating substrate 200 formed of silicon, plastic or glass and/or on a buffer film 205. The buffer film 205 is selectively formed to planarize the substrate 200, and may be formed of $SiO_2$ to a thickness of about 3000 Å using plasma enhanced chemical vapor deposition (PECVD), atmospheric pressure CVD (APCVD), low pressure CVD (LPCVD), or electron cyclotron resonance (ECR).

The gate electrode 210 may be formed of a material having a small work function, such as Al, AlNd, or MoW, so as to embody a p-channel TFT. The gate electrode 210 may be formed by stacking a gate metal film using sputtering to a thickness of 300 Å, and etching the film using photolithography.

Alternatively, to form the gate electrode 210, a substrate covered by a shadow mask so as to define a gate electrode is loaded into a vacuum chamber, and a metal for the gate electrode is put into a metal boat. The vacuum chamber is adjusted to a vacuum of about $5\times10^{-4}$ Torr or less, preferably about $5\times10^{-7}$ Torr. The metal for the gate electrode is deposited at a speed of 3 to 5 Å/sec, thereby forming the gate electrode 210. As an example, an aluminum gate electrode can be formed to a thickness of about 1700 Å.

A gate insulating film 220 is formed so as to cover the substrate 200 and the gate electrode 210. The gate insulating film 220 may be a silicon oxide film. In addition to $Ba_xSr_{1-x}TiO_3$ BST(barium strontium titanate), the gate insulating film 220 may be formed of $Ta_2O_5$, $Y_2O_3$, $TiO_2$, ferroelectric insulating materials, $PbZr_{1-x}Ti_xO_3$(PZT), $Bi_4Ti_3O_{12}$, $BaMgF_4$, $SrBi_2(Ta_{1-x}Nb_x)_2O_9$, $Ba(Zr_{1-x}Ti_x)O_3$(BZT), $BaTiO_3$, or $SrTiO_3$.

On top of the gate insulating film 220, source electrode 230a and drain electrode 230b are located. The source electrode 230a and drain electrode 230b are formed by stacking a source/drain metal film using sputtering to a thickness of 5000 Å, and by etching the film using photolithography.

In another method of forming the source electrode 230a and drain electrode 230b, the substrate 200 may be covered by a shadow mask, and metal having a large work function may be vacuum deposited on the substrate 200. The metal having a large work function may be Au. A vacuum deposition chamber is adjusted to $5\times10^{-4}$ Torr or less, preferably about $5\times10^{-7}$ Torr. The metal is deposited at a speed of 3 to 5 Å/sec, thereby forming the source electrode 230a and drain electrode 230b to a thickness of about 1500 Å.

An organic acceptor film 235 is coated on the source electrode 230a and drain electrode 230b, and an organic semiconductor film 240 is disposed on the organic acceptor film 235.

In a typical TFT, an electric potential barrier is generated due to the difference in work function between source/drain electrodes 230a, 230b and an organic semiconductor film 240, precluding the injection of carriers, and thus increasing contact resistance therebetween. Generally, the contact resistance can be reduced by forming the source/drain electrodes 230a, 230b from a metal that has a work function similar to that of the organic semiconductor film. In the present invention, by forming the organic acceptor film 235 between the source/drain electrodes 230a, 230b and the organic semiconductor film 240 using an electron withdrawing material, contact resistance is reduced, injection of carriers is improved, and charge mobility increases.

In the organic TFT shown in FIG. 2A, the organic acceptor film 235 contacts the source electrode 230a and drain electrode 230b, and a portion of the gate insulating film 220 which is exposed between the source electrode 230a and drain electrode 230b. In the organic TFT shown in FIG. 2B, the organic acceptor film 235 contacts the source electrode 230a and drain electrode 230b. During manufacture, the organic acceptor film 235 may be formed by depositing a single layer formed only from an organic acceptor material, or by co-depositing an organic semiconductor material and the organic acceptor material around an interface between the organic semiconductor film 240 and the source and drain electrodes 230a, 230b. If the organic semiconductor material and the organic acceptor material are co-deposited, the organic acceptor film 235 may be formed of 0.1% to 10% by weight of the organic acceptor material.

The organic acceptor film 235 includes a charge transfer material that can form a charge transfer complex on the surface of the source and drain electrodes 230a, 230b. Thus, the organic semiconductor film 240 obtains a channel doping effect to exclude energy barrier characteristics, and the amount of carriers injected into a channel increases. As a result, contact resistance is reduced, injection of the carriers is improved, and charge mobility increases.

Figure 4A:
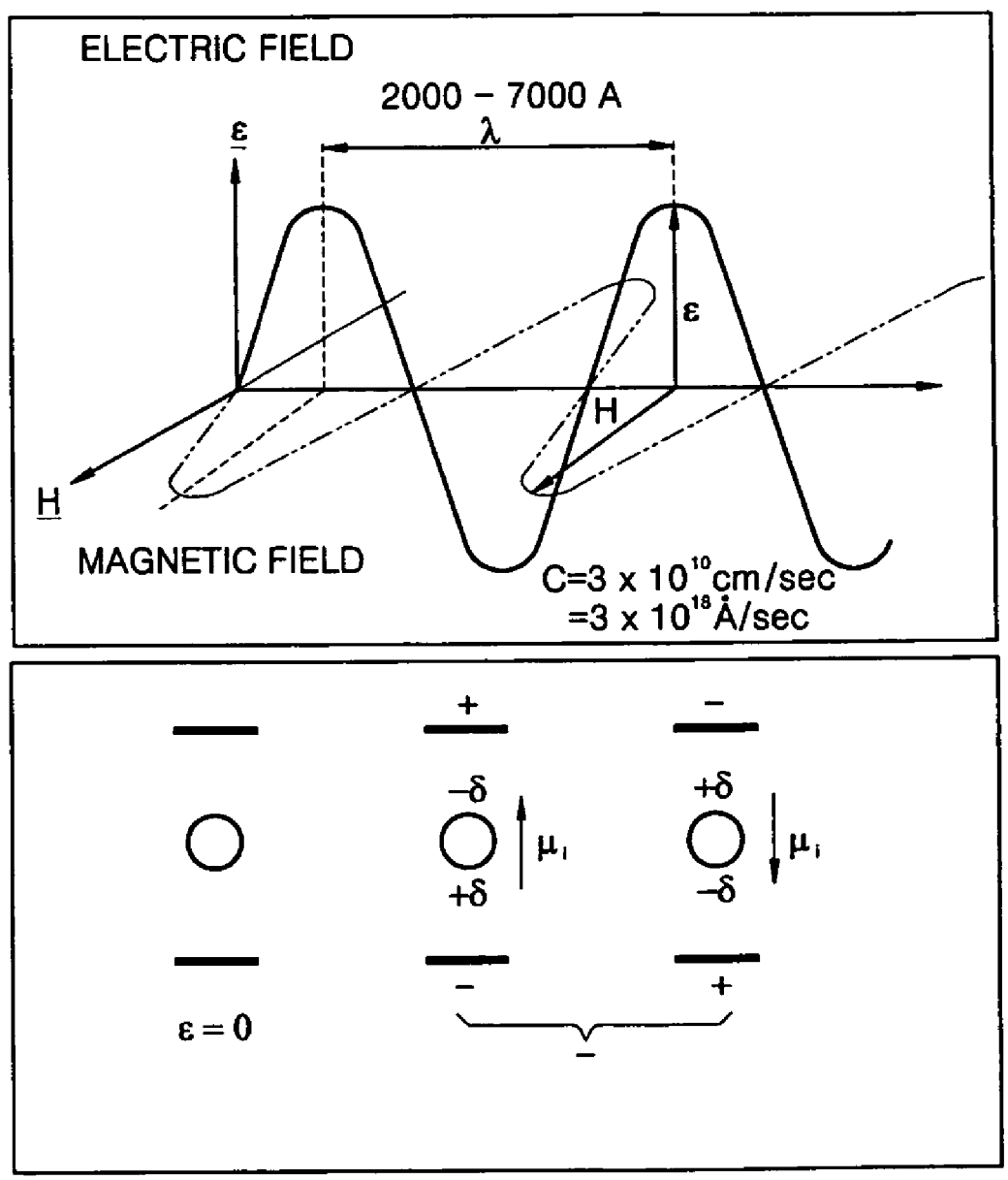
FIG. 4A shows the variation of the dipole moment of a molecule with respect to an electric field.
Figure 4B:
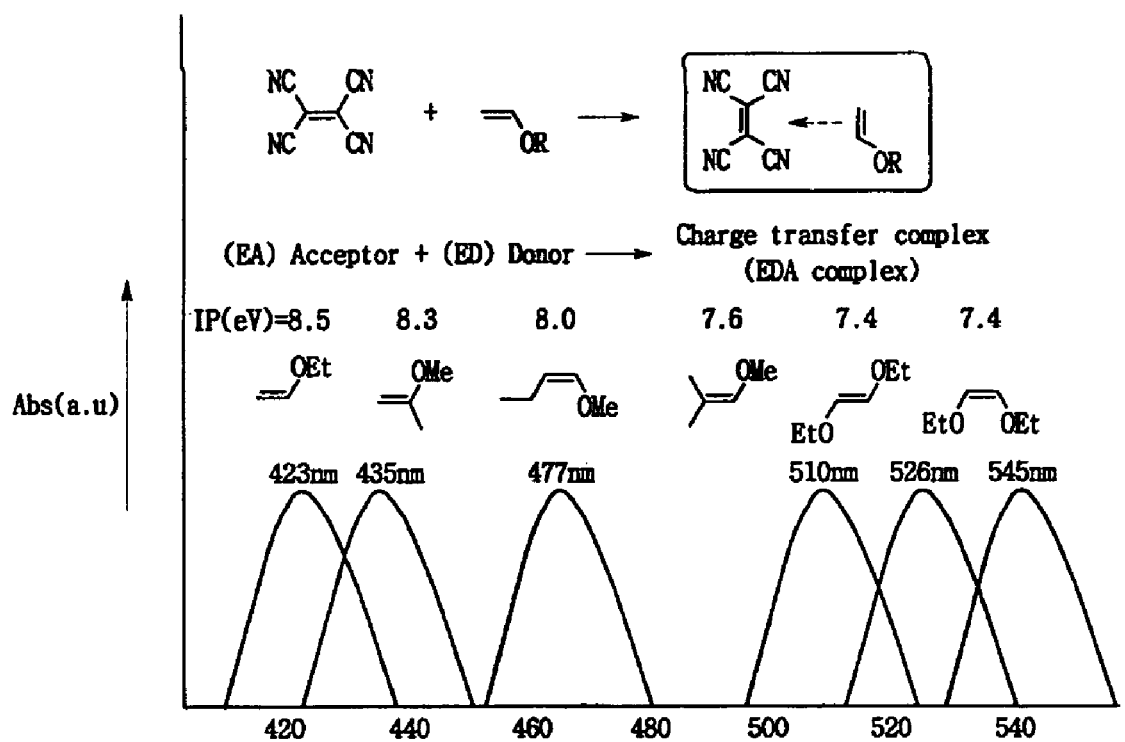
FIG. 4B shows the formation of a charge transfer complex where electrons are donated and withdrawn from an electron donating material and an electron withdrawing material.

FIG. 4A shows the variation of dipole moment of a molecule with respect to an electric field, and FIG. 4B shows the formation of charge transfer complex where electrons are donated and withdrawn from an electron donating material and an electron withdrawing material.

As can be seen from FIG. 4A, when the electric field is applied, the dipole moment of the molecule is maximized. As can be seen from FIG. 4B, when the dipole moment occurs, the charge transfer complex is formed so that electrons are donated and withdrawn from the electron donating material and the electron withdrawing material.

The organic acceptor film 235 (FIGS. 2A and 2B) maybe formed by depositing at least one electron withdrawing material selected from the group consisting of aromatic compounds, olefine compounds, aromatic-olefine compounds, aromatic-aromatic conjugated compounds, fused aromatic compounds, and hetero cyclic compounds, which contain at least one selected from the group consisting of nitro group ($NO_2$), cyano group (CN), sulfonyl group ($SO_2$), sulfoxide group (SO), carbonyl group (CO), carboxyl group ($CO_2$), ester group (COO), anhydride, imide, imine, halogen group, fluoroalkyl group, and fluoroaromatic group.

In an embodiment of the present invention, the electron withdrawing material may be formed of at least one selected from the group consisting of 2,4,7-trinitrofluorenone, 4-nitroaniline, 2,4-dinitroaniline, 5-nitroanthranilonitrile, 2,4-dinitrophenylamine, 1,5-dinitronaphthalene, 4-nitrobiphenyl, 9,10-dicyanoanthracene, 3,5-dinitrobenzonitrile, and N,N'-bis(di-t-buytlphenyl)-3,4,9,10-perylenedicarboxyimide.

The organic semiconductor film 240 shown in FIG. 2A is disposed on the organic acceptor film 235. The organic semiconductor film 240 is formed using vacuum deposition, preferably thermal evaporation, on the source and drain electrodes 230a, 230b on which the electron withdrawing material is coated. The organic semiconductor film 240 is formed of an organic semiconductor material, such as pentacene, oligo-thiophene, poly(alkyl-thiophene), or poly(thienylenevinylene). Preferably, the organic semiconductor film 240 is formed of pentacene. The organic semiconductor film 240 is deposited at a vacuum of $5 \times 10^{-4}$ Torr or less, preferably about $5 \times 10^{-7}$ Torr, and at a speed of 0.5 Å/sec to a thickness of about 1000 Å.

The organic acceptor film 235 is formed by depositing a single layer formed of only an organic acceptor material, or by co-depositing an organic semiconductor film forming material (e.g., pentacene) and an organic acceptor material. In the latter case, the organic semiconductor film forming material and the organic acceptor material are co-deposited around an interface between the organic semiconductor film 240 and the source and drain electrodes 230a, 230b. In the organic TFT shown in FIGS. 2A and 2B, since the source electrode 230a and drain electrode 230b are located below the organic semiconductor film 240, the organic acceptor film 235 can be formed by depositing 0.1% to 10% by weight of the organic acceptor material around the interface between the organic semiconductor film 240 and the source and drain electrodes 230a, 230b when the formation of the organic semiconductor film 240 begins.

Figure 5:
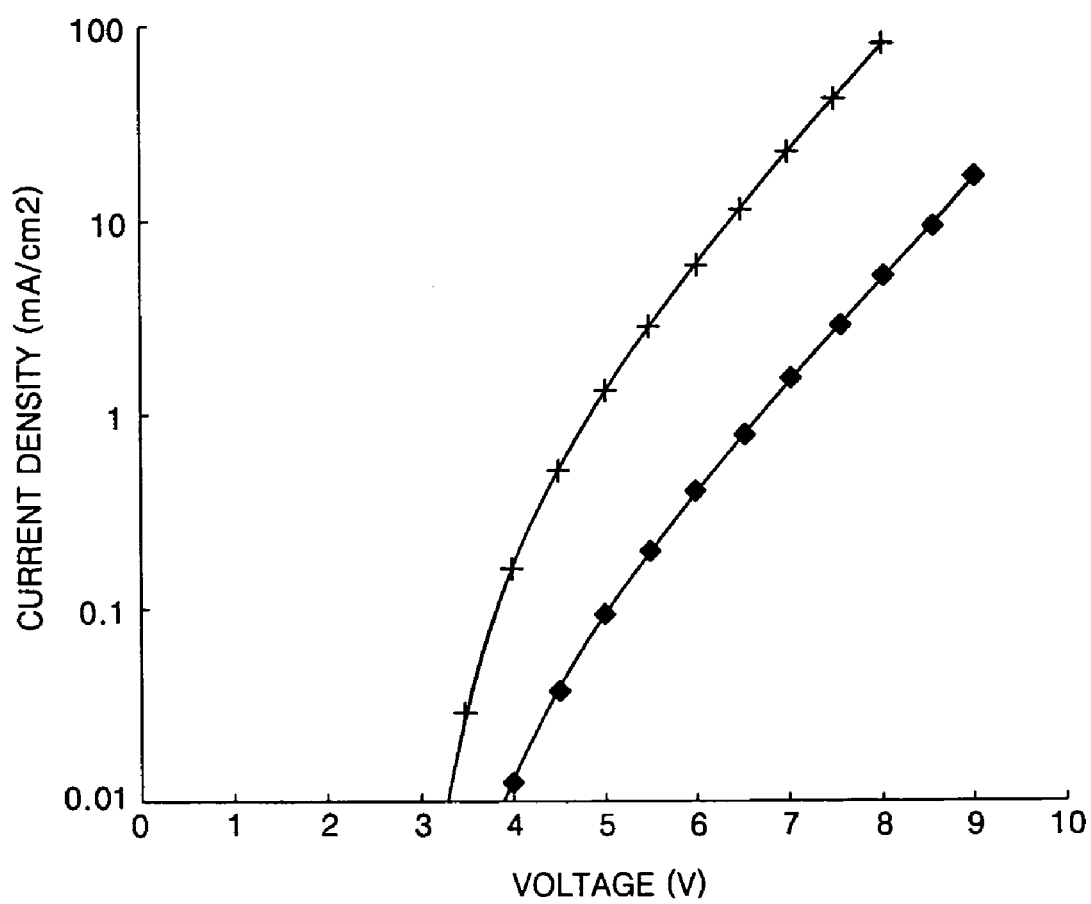
FIG. 5 is a graph of current density versus voltage of an organic TFT according to the present invention.
Figure 6A:
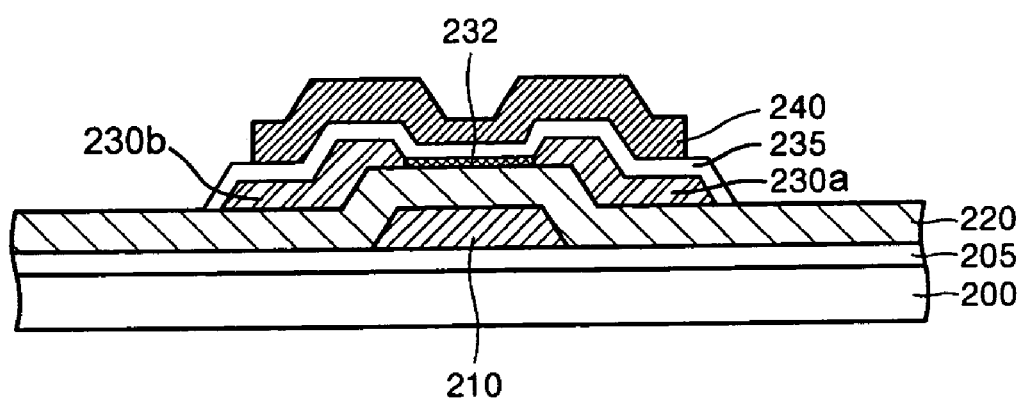
FIGS. 6A and 6B are cross-sectional views of an organic TFT wherein a surface processing film is formed to reinforce interfacial adhesion.
Figure 6B:
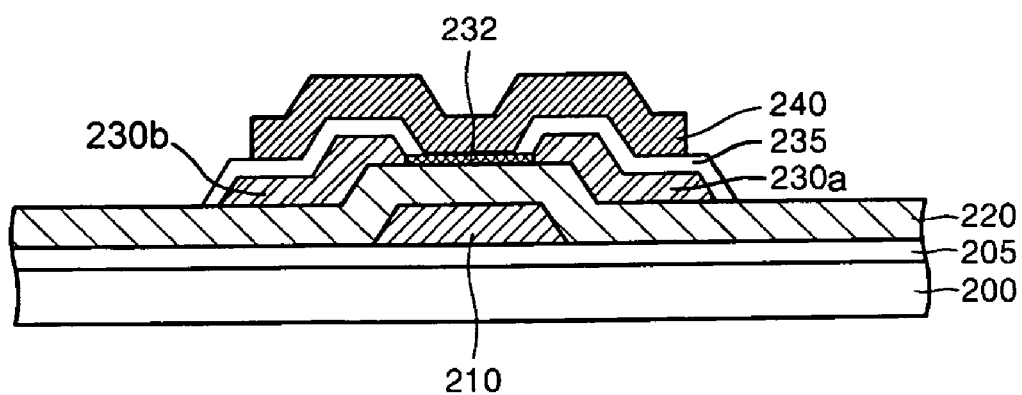
Figure 7A:
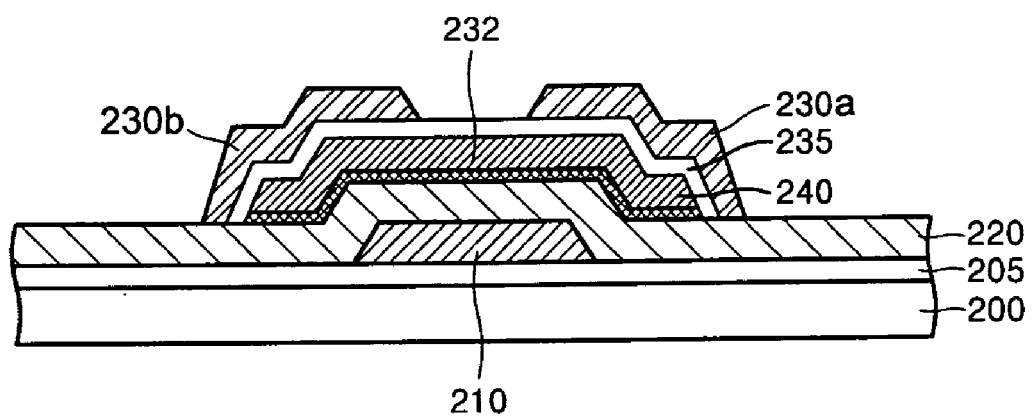
FIGS. 7A and 7B are cross-sectional views of another organic TFT wherein a surface processing film is formed to reinforce interfacial adhesion.
Figure 7B:
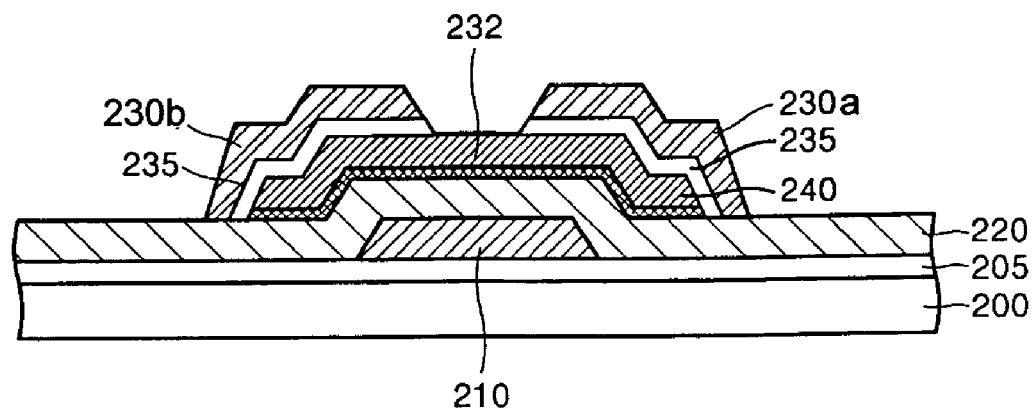

FIG. 5 is a graph of current density versus voltage for an organic TFT according to the present invention. In FIG. 5, the data marked with squares (■) show the case wherein no organic acceptor film 235 is coated, while the data marked with Xes (x) shows the case where the organic acceptor film 235 is coated.

Referring to FIG. 5, under the same conditions, when the organic acceptor film 235 is coated, the turn-on voltage is reduced from 4 V to 3.2 V, and the current density measured at 5V is greatly increased from 0.1 to 1 $mA/cm^2$. Thus, the amount of carriers injected into a channel increases greatly, and this results in an increase in charge mobility.

Figure 3A:
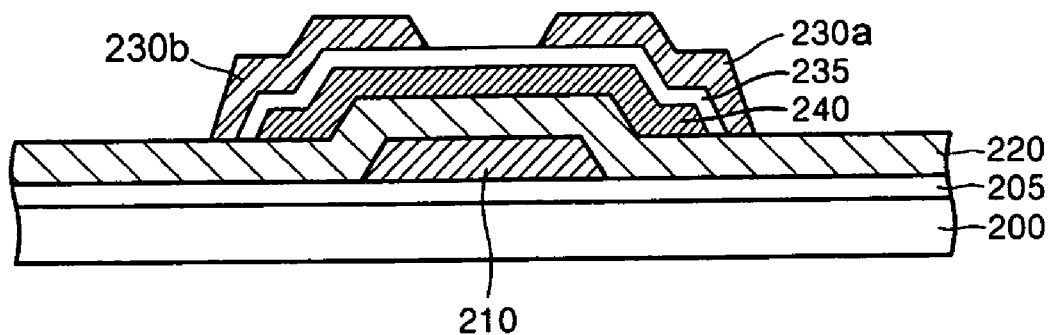
FIGS. 3A and 3B are cross-sectional views of an organic TFT according to another embodiment of the present invention.
Figure 3B:
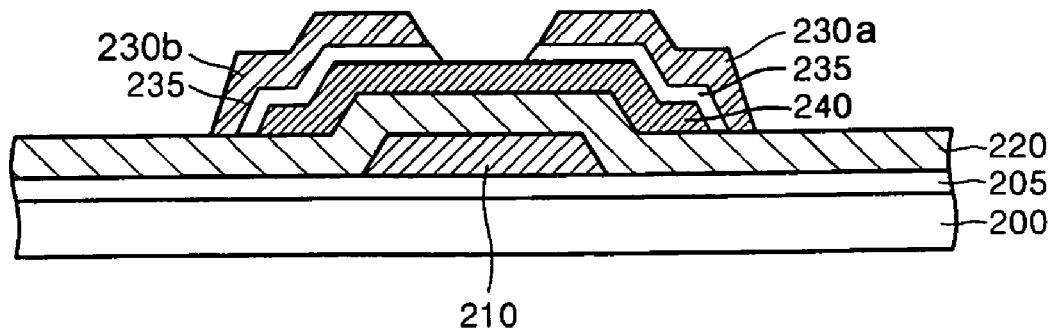

FIGS. 3A and 3B are cross-sectional views of an organic TFT according to another embodiment of the present invention. In the organic TFT, an organic semiconductor film 240 is interposed between a gate electrode 210 and source and drain electrodes 230a, 230b.

Referring to FIG. 3A, the organic TFT includes the gate electrode 210, which is located on an insulating substrate 200 formed of silicon, plastic, or glass and/or a buffer film 205. The buffer film 205 is selectively formed to planarize the substrate 200, and is formed of $SiO_2$ to a thickness of about 3000 Å using PECVD, APCVD, LPCVD, or ECR.

The gate electrode 210 is formed of a material having a small work function, such as Al, AlNd, or MoW, so as to embody a p-channel TFT. A gate insulating film 220 is formed to cover the substrate 200 and the gate electrode 210. The gate insulating film 220 may be a silicon oxide film.

The organic semiconductor film 240 is formed on the gate insulating film 220.

The organic semiconductor film 240 is formed using vacuum deposition, preferably thermal evaporation, on the source electrode 230a and drain electrode 230b on which an electron withdrawing material is coated. The organic semiconductor film 240 is formed of an organic semiconductor material, such as pentacene, oligo-thiophene, poly(alkyl-thiophene), or poly(thienylenevinylene). Preferably, the organic semiconductor film 240 is formed of pentacene. The organic semiconductor film 240 is deposited at a degree of vacuum of $5 \times 10^{-4}$ Torr or less, preferably about $5 \times 10^{-7}$ Torr, and at a speed of 0.5 Å/sec to a thickness of about 1000 Å.

As can be seen from FIGS. 3A and 3B, the source electrode 230a and drain electrode 230b are formed on the organic semiconductor film 240, and an organic acceptor film 235 is interposed between the source and drain electrodes 230a, 230b and the organic semiconductor film 240. The organic acceptor film 235 is formed by depositing a single layer formed of only an organic acceptor material, or by co-depositing an organic semiconductor film forming material (e.g., pentacene) and an organic acceptor material. In the organic TFT shown in FIGS. 3A and 3B, since the source electrode 230a and drain electrode 230b are located above the organic semiconductor film 240, the organic acceptor film 235 can be formed by depositing 0.1 to 10% by weight of the organic acceptor material around the interface between the organic semiconductor film 240 and the source and drain electrodes 230a, 230b when the formation of the organic semiconductor film 240 is completed.

The organic acceptor film 235 includes a charge transfer material that can form a charge transfer complex on the surface of the source electrode 230a and drain electrode 230b. Thus, the organic semiconductor film 240 obtains a channel doping effect to exclude energy barrier characteristics, and the amount of carriers injected into a channel increases. As a result, contact resistance is reduced, injection of the carriers is improved, and charge mobility increases. The organic acceptor film 235 should be formed to a small thickness of 100 Å or less such that injection of carriers is improved without raising the conductance of an active film.

The organic acceptor film 235 is formed by depositing at least one electron withdrawing material selected from the group consisting of aromatic compounds, olefine compounds, aromatic-olefine compounds, aromatic-aromatic conjugated compounds, fused aromatic compounds, and hetero cyclic compounds, which contain at least one selected from the group consisting of nitro group ($NO_2$), cyano group (CN), sulfonyl group ($SO_2$), sulfoxide group (SO), carbonyl group (CO), carboxyl group ($CO_2$), ester group (COO), anhydride, imide, imine, halogen group, fluoroalkyl group, and fluoroaromatic group.

In an embodiment of the present invention, the electron withdrawing material is formed of at least one selected from the group consisting of 2,4,7-trinitrofluorenone, 4-nitroaniline, 2,4-dinitroaniline, 5-nitroanthranilonitrile, 2,4-dinitrophenylamine, 1,5-dinitronaphthalene, 4-nitrobiphenyl, 9,10-dicyanoanthracene, 3,5-dinitrobenzonitrile, and N,N'-bis(di-t-buytlphenyl)-3,4,9,10-perylenedicarboxyimide.

The source electrode 230a and drain electrode 230b are formed on the organic acceptor film 235. To form the source electrode 230a and drain electrode 230b, a source/drain metal film is stacked to a thickness of 5000 Å using sputtering, and is etched using photolithography. In another method, the substrate 200 is covered by a shadow mask, and a metal having a large work function is vacuum deposited on the substrate 200, thereby forming the source electrode 230a and drain electrode 230b of the TFT. The metal having a large work function may be Au.

In another embodiment, as shown in FIGS. 6A thru 7B, before or after the organic semiconductor film 240 is deposited, a surface processing material, such as octadecyltrichlorosilane (OTS), is coated on the gate insulating film 220, thus forming a surface processing film 232.

The surface processing film 232 reinforces interfacial adhesion and crowds organic molecules. This surface processing film 232 maybe interposed between the gate insulating film 220 and the organic acceptor film 235 (refer to FIG. 6A), or between the gate insulating film 220 and the organic semiconductor film 240 (refer to FIGS. 6B, 7A, and 7B).

The surface processing film 232 may include one selected from the group consisting of trichlorosilyl-(—$SiCl_3$), trimethoxysilyl-(—$Si(OMe)_3$), and mercapto-(—SH) moieties.

Figure 8:
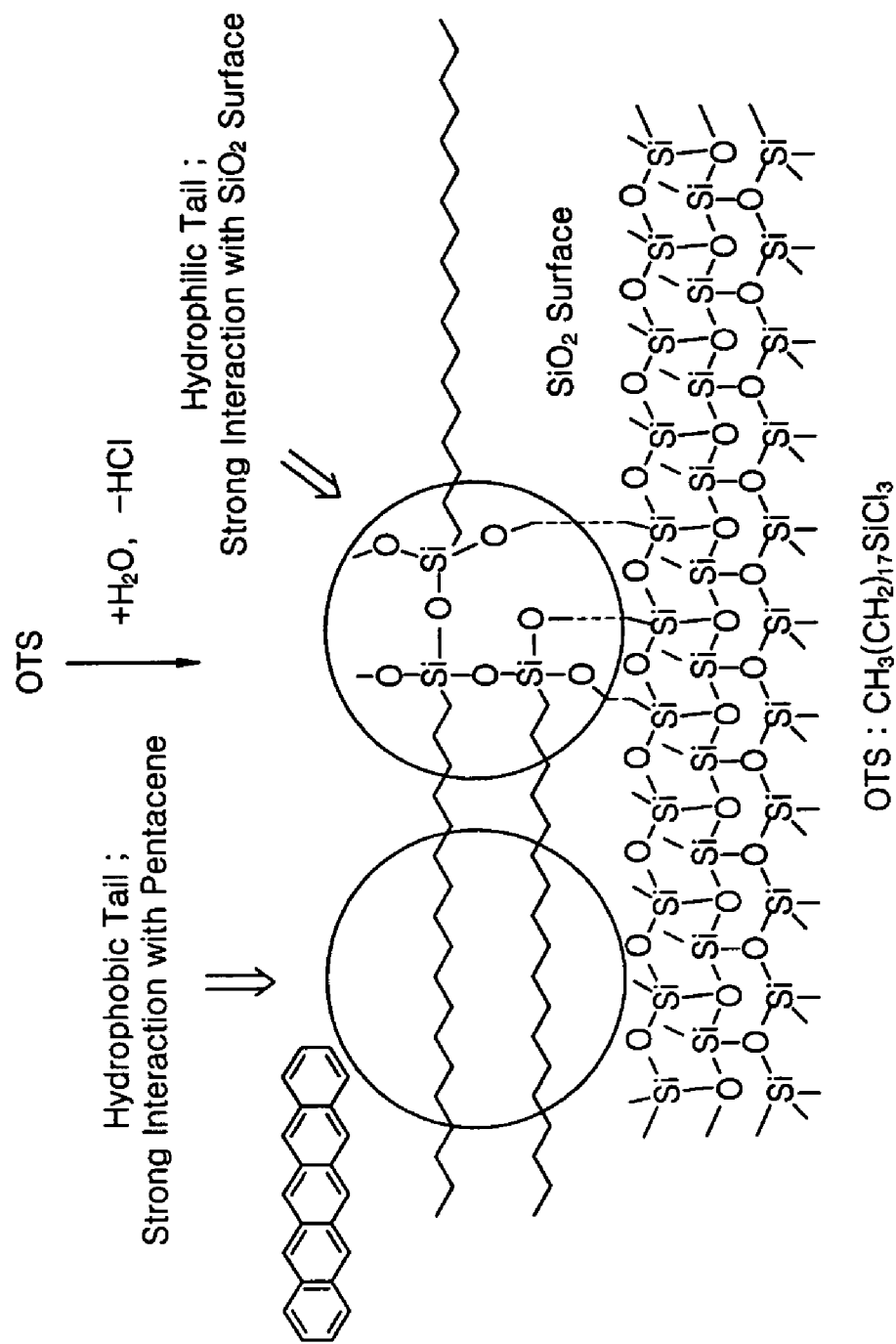
FIG. 8 shows the coupling structure of the surface of an oxide film processed with OTS.

FIG. 8 shows the coupling structure of the surface of an $SiO_2$ film processed with OTS. In this case, a hydrophilic tail, which faces an oxide film, strongly interacts with the surface of the $SiO_2$ film, while a hydrophobic tail strongly interacts with pentacene of the organic semiconductor film 240.

Thus, field effect mobility is greatly improved to about 0.3 $cm^2$/V.sec, the on/off ratio that determines the characteristic of a switching device is markedly increased to $10^6$, and the turn-off leakage current is reduced to about $10^{-11}$ A. These parameters satisfy the requisites for a switching device, i.e., a field effect mobility of at least 0.1 $cm^2$/V.sec and an on/off ratio of $10^6$ to $10^8$, and are achieved by crowding the pentacene molecules and reinforcing the adhesion between pentacene and OTS molecules.

In an organic TFT of the present invention, despite the energy barrier required to form a carrier accumulation film, an organic acceptor film which can form a charge transfer complex is coated so as to produce a channel doping effect and exclude energy barrier characteristics. Thus, by increasing the amount of carriers injected into the channel of an active film, contact resistance is reduced and charge mobility increases.

Also, the organic acceptor film which can form a charge transfer complex is coated to a small thickness, so that a doping effect is achieved, but the conductivity of the active film is unchanged. Thus, the on/off ratio of the organic TFT is not reduced.

The organic TFT of the present invention further includes a surface processing film which reinforces adhesion between a gate insulting film formed of $SiO_2$ and an adjacent layer, and also crowds pentacene molecules, thereby further improving charge mobility.

While the present invention has been particularly shown and described with reference to exemplary embodiments thereof, it will be understood by those of ordinary skill in the art that various changes in form and detail may be made therein without departing from the spirit and scope of the present invention as defined by the following claims.

For example, although it is described in the embodiments and shown in the drawings that the organic semiconductor film 240 is located on or under the source electrode 230a and drain electrode 230b, the present invention can be also applied to coplanar, inverse coplanar, staggered, and inverse staggered types. In addition, a portion of the organic semiconductor film 240 may extend to the lateral surface of the source and drain electrodes 230a, 230b.

What is claimed is:

1. An organic thin film transistor, comprising:
   an organic semiconductor film;
   source and drain electrodes electrically connected to the organic semiconductor film;
   a gate electrode electrically insulated from the source and drain electrodes and the organic semiconductor film; and
   an organic acceptor film interposed between the source and drain electrodes, which are disposed on one side of the organic acceptor film, and the organic semiconductor film, which is disposed on another side of the organic acceptor film;
   wherein the organic acceptor film comprises a material which forms the organic semiconductor film and a material which forms the organic acceptor film, and
   wherein the material which forms the organic acceptor film is 0.1% to 10% by weight.

2. The organic thin film transistor of claim 1, wherein the organic semiconductor film is formed of pentacene.

3. The organic thin film transistor of claim 1, further comprising a gate insulating film which electrically insulates the source and drain electrodes from the gate electrode;
   wherein the organic acceptor film contacts the source and drain electrodes and the gate insulating film.

4. The organic thin film transistor of claim 3, further comprising a surface processing film which reinforces adhesion between the gate insulating film and the organic acceptor film.

5. The organic thin film transistor of claim 4, wherein the surface processing film is formed of any one selected from the group consisting of trichlorosilyl-(—$SiCl_3$), trimethoxysilyl-(—$Si(OMe)_3$), and mercapto-(—SH) moieties.

6. The organic thin film transistor of claim 1, further comprising a gate insulating film which electrically insulates the source and drain electrodes from the gate electrode;
   wherein the organic acceptor film contacts the source and drain electrodes.

7. The organic thin film transistor of claim 6, further comprising a surface processing film which reinforces adhesion between the gate insulating film and the organic semiconductor film.

8. The organic thin film transistor of claim 7, wherein the surface processing film is formed of any one selected from the group consisting of trichlorosilyl- (-SiCl$_3$S), trimethoxysilyl-(—Si(OMe)$_3$), and mercapto-(—SH) moieties.

9. The organic thin film transistor of claim 1, wherein the organic acceptor film is formed of at least one electron withdrawing material selected from the group consisting of aromatic compounds, olefine compounds, aromatic-olefine compounds, aromatic-aromatic conjugated compounds, fused aromatic compounds, and hetero cyclic compounds, which contain at least one selected from the group consisting of nitro group (NO$_2$), cyano group (CN), sulfonyl group (SO$_2$), sulfoxide group (SO), carbonyl group (CO), carboxyl group (C0$_2$), ester group (COO), anhydride, imide, imine, halogen group, fluoroalkyl group, and fluoroaromatic group.

10. The organic thin film transistor of claim 1, wherein the organic acceptor film is formed of at least one electron withdrawing material selected from the group consisting of 2,4,7-trinitrofluorenone, 4-nitroaniline, 2,4-dinitroaniline, 5-nitroanthranilonitrile, 2,4-dinitrophenylamine, 1,5-dinitronaphthalene, 4-nitrobiphenyl, 9,10-dicyanoanthracene, 3,5-dinitrobenzonitrile, and N,N'-bis(di-t-buytlphenyl)-3,4,9,10-perylenedicarboxyimide.

11. The organic thin film transistor of claim 10, wherein the organic acceptor film is formed by co-depositing the material which forms the organic semiconductor film and the material which forms the organic acceptor film around the interface between the organic semiconductor film and the source and drain electrodes, and is formed of 0.1 to 10% by weight of the material which forms the organic acceptor film.

12. The organic thin film transistor of claim 1, wherein the organic acceptor film has a thickness in a range of 1 Å to 100 Å.

13. An organic thin film transistor, comprising:
an organic semiconductor film;
source and drain electrodes electrically connected to the organic semiconductor film;
a gate electrode electrically insulated from the source and drain electrodes and the organic semiconductor film; and
an organic acceptor film interposed between the source and drain electrodes and the organic semiconductor film;
wherein the organic acceptor film is formed of at least one electron withdrawing material selected from the group consisting of olefine compounds and hetero cyclic compounds, which contain at least one selected from the group consisting of nitro group (NO$_2$), cyano group (CN), sulfonyl group (SO$_2$), sulfoxide group (SO), carbonyl group (CO), carboxyl group (CO$_2$), ester group (COO), imide, imine, halogen group and fluoroalkyl group;
wherein the organic acceptor film comprises said at least one electron withdrawing material and a material which forms the organic semiconductor film, and
wherein the electron withdrawing material is 0.1% to 10% by weight.

14. The organic thin film transistor of claim 13, wherein the organic acceptor film is formed of at least one electron withdrawing material selected from the group consisting of 2,4,7-trinitrofluorenone, 4-nitroaniline, 2,4-dinitroaniline, 5-nitroanthranilonitrile, 2,4-dinitrophenylamine, 1,5-dinitronaphthalene, 4-nitrobiphenyl, 9,10-dicyanoanthracene, 3,5-dinitrobenzonitrile, and N,N'-bis(di-t-buytlphenyl)-3,4,9,10-perylenedicarboxyimide.

15. The organic thin film transistor of claim 13, wherein the organic acceptor film has a thickness in a range of 1 Å to 100 Å.

16. The organic thin film transistor of claim 13, further comprising a gate insulating film which electrically insulates the source and drain electrodes from the gate electrode;
wherein the organic acceptor film contacts the source and drain electrodes.

17. The organic thin film transistor of claim 16, further comprising a surface processing film which reinforces adhesion between the gate insulating film and the organic semiconductor film.

18. The organic thin film transistor of claim 17, wherein the surface processing film is formed of any one selected from the group consisting of trichiorosilyl-(—SiCl$_3$), trimethoxysilyl-(—Si(OMe)$_3$), and mercapto-(—SH) moieties.

* * * * *